United States Patent [19]

Takayama

[11] 4,215,312
[45] Jul. 29, 1980

[54] RADIO RECEIVER

[75] Inventor: Kazuo Takayama, Kobe, Japan

[73] Assignee: Fujitsu Ten Limited, Kobe, Japan

[21] Appl. No.: 915,570

[22] Filed: Jun. 14, 1978

[30] Foreign Application Priority Data

Jun. 16, 1977 [JP] Japan .................................. 52-71408
Jun. 16, 1977 [JP] Japan .................................. 52-71409

[51] Int. Cl.² .......................... H04B 1/18; H03H 11/00
[52] U.S. Cl. .................................... 455/284; 333/214; 455/289
[58] Field of Search ............... 325/452, 454, 427, 373, 325/376–380, 383, 386; 343/701, 722; 333/80 R, 80 T, 213, 214, 216; 179/79, 80, 170 G

[56] References Cited

U.S. PATENT DOCUMENTS

| 3,578,911 | 5/1971 | Bender et al. ......................... 325/383 |
| 3,579,113 | 5/1971 | Jabbar et al. ......................... 325/376 |
| 3,646,449 | 2/1972 | Hellbarth et al. ..................... 325/383 |
| 3,693,096 | 9/1972 | Dosey et al. ......................... 325/383 |
| 3,832,654 | 8/1974 | Kiko ................................... 333/80 R |
| 3,953,799 | 4/1976 | Albee ................................. 325/376 |

Primary Examiner—Marc E. Bookbinder
Attorney, Agent, or Firm—Oblon, Fisher, Spivak, McClelland & Maier

[57] ABSTRACT

A radio receiver comprises an antenna circuit represented by an equivalent circuit consisting of an antenna electromotive force, an antenna capacitance in series with said electromotive force and a cable capacitance in parallel with them, a negative capacitance circuit connected to the antenna circuit for at least partially cancelling the antenna capacitance and the cable capacitance and a tuning circuit for receiving the output of the antenna circuit. The negative capacitance circuit, composed of a capacitor, transistors and the like, improves the S/N ratio.

6 Claims, 26 Drawing Figures

RADIO RECEIVER

DESCRIPTION OF THE INVENTION

This invention concerns a radio receiver and, in particular, its antenna circuit.

The equivalent circuit of an antenna for AM radio receivers installed on automobiles comprises, as shown in FIG. 1, an antenna electromotive force 1 having a voltage $E_1$, an antenna capacitance 2 having a capacitance value CA and a cable capacitance 3 having a capacitance value CB, and leads to an output terminal 4 of the antenna circuit (or input terminal to the side of the receiver). The antenna capacitance CA is about 15 pF and the cable capacitance CB is about 65 pF for short cables and more than 100 pF for longer ones. Since open-circuit voltage $E_2$ at the output terminal 4 is represented as:

$$E2 = E1 \cdot \frac{CA}{CA + CB} \tag{1}$$

the voltage $E_2$ that can be taken out is significantly decreased from the antenna electromotive force $E_1$ if the cable capacitance CB is great. In order to compensate the above voltage decay, an inductor 5 having a inductance Lo is sometimes connected to the output terminal 4 as shown in FIG. 2 so that the output voltage $E_2$ may be increased through resonance. A $\mu$-tuning type receiver is one of such examples, in which the inductor 5 is made variable so as to select the broadcasting stations by resonating with the capacitances 2 and 3. The output voltage $E_2$ at the resonance point can be represented as:

$$E2 = E1 \cdot \frac{CA}{CA + CB} \cdot QL \tag{2}$$

where QL is a selectively of the resonance circuit. In the $\mu$-tuning type automobile AM radio receiver, while a required S/N ratio can be obtained if the cable length is relatively short, the voltage reduction represented by CA/(CA+CB) is remarkable if the cable length is longer making it difficult to attain a required S/N ratio.

Where C-tuning arrangement is employed for attaining electronic tuning by the use of a varicap diode and the like, the following disadvantages are resulted due to the cable capacitance 3. Namely, in a capacitance variable type antenna circuit shown in FIG. 3, a varicap diode 6 has to contain the following variable capacitance Co in order to vary the tunable frequency in this circuit over a range between 525-1605 KHz (AM broadcast frequency band):

$$Co\ max = (CA + CB + Co\ min)\ 9.4 \tag{3}$$

where Co max and Co min represent the maximum and minimum values of Co and the coefficient 9.4 represents $(1605/525)^2$. Reference 7 denotes a fixed inductor having a constant inductance L. If the cable capacitance CB is great, Co max and Co max/Co min are increased respectively. Since the value for the output voltage $E_2$ is determined by the equation (4), increased variable capacitance value Co leads to the decrease in $E_2$ and S/N ratio, and the increase in Co max/Co min ratio renders it difficult to select the varicap diodes.

$$E2 = E1 \cdot \frac{CA}{CA + CB + Co} \cdot QL \tag{4}$$

The foregoing various problems arise from the antenna capacitance CA and, in particular, the cable capacitance CB. Then, if these capacitances can be cancelled out, a significant improvement in the S/N ratio and the like can be expected.

It is, accordingly, an object of this invention to cancell the cable capacitance, thereby enabling to attain a satisfactory S/N ratio in the antenna circuit of a receiver even when a long cable is used and facilitating the selection of the varicap diodes for use with C-tuning system.

It is another object of this invention to provide a negative capacitance circuit for cancelling the cable capacitance and the like.

According to the radio receiver of this invention, an antenna circuit, which is represented in an equivalent manner by an antenna electromotive force, an antenna capacitance connected in series to the antenna electromotive force and a cable capacitance connected in parallel with them, is connected with a negative capacitance circuit which at least partially cancelling the cable capacitance and the antenna capacitance thereby enabling to improve the S/N ratio.

The above negative capacitance circuit consists of a capacitor, and a control circuit including transistors which upon reception of an input voltage apply to the above capacitor a voltage corresponding to the above input voltage thereby causing a current defined by the reactance of the capacitor to output to the input terminal, enabling to attain satisfactory characteristics in a simple structure. While two transistors are used in the above control circuit, they can be diminished to one by the use of a transformer.

This invention is to be described in more detail referring to the accompanying drawings, in which.

Figure 1:
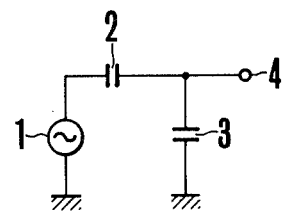
FIG. 1 is an equivalent circuit diagram of an antenna.
Figure 2:
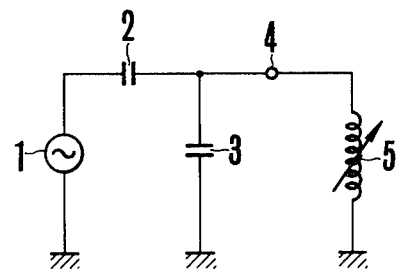
FIG. 2 is an equivalent circuit diagram of an antenna connected with a $\mu$-tuning circuit.
Figure 3:
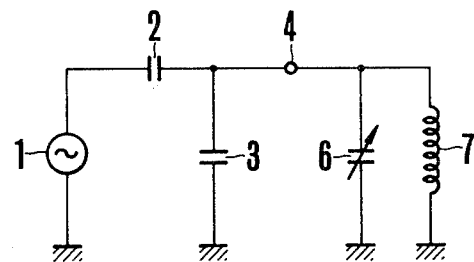
FIG. 3 is an equivalent circuit diagram of an antenna connected with a C-tuning circuit.
Figure 4:
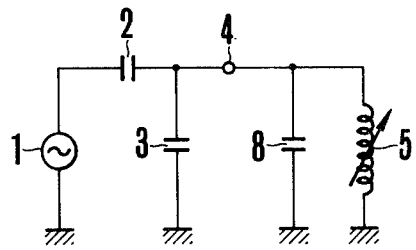
FIG. 4 and FIG. 5 are circuit diagrams showing fundamental forms of the invention.

Referring at first to FIG. 4, which shows a fundamental form of this invention comprising, as in FIG. 1, an antenna electromotive force 1 at voltage E1, an antenna capacitance 2 having a capacitance value CA and a cable capacitance 3 having a capacitance value CB. A negative capacitor 8 having a capacitance value $-C$ and a variable inductor 5 of a $\mu$-tuner are also shown. The output voltage E2 of the circuit is represented as:

$$E2 = E1 \frac{CA}{CA + CB - C} \cdot QL \tag{5}$$

and the output voltage E2 can be increased to improve the S/N ratio by putting the negative capacitance value $-C$ closer to CB and further to CA+CB. While the S/N ratio can be improved more as the capacitances 2 and 3 are cancelled more thoroughly by the negative capacitance value $-C$, the offset should be restricted to an appropriate extent since excess cancellation brings about unstability.

Figure 5:
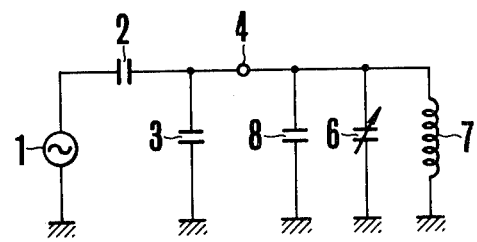

FIG. 5 shows another fundamental form of this invention using a variable capacitance type tuning circuit in which a variable capacitance 6 such as a varicap diode and a fixed inductor 7 having an inductance L constitute a C-tuning type circuit. Reference numeral 8 denotes the foregoing negative capacitance. The output voltage can be increased to thereby improve the S/N ratio also in this case by putting the negative capacitance value $-C$ closer to CA+CB. Setting the negative capacitance value $-C$ equal to CA+CB, Co ratio in the equation (3) can be rewritten as:

$$\text{Co max} = 9.4 \text{ Co min} \tag{6}$$

Since varicap diodes having a variation ratio of the above order is easily available, the construction of the tuning circuit can be facilitated.

Figure 6:
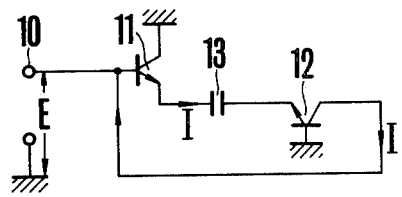
FIG. 6 is a circuit diagram showing first embodiment of a negative capacitance circuit.

The negative capacitance 8 can be attained by the circuit as shown in FIG. 6 and the like. In FIG. 6, npn transistors 11 and 12 and a capacitor 13 of a capacitance value Ce are connected as shown in the figure. Referring to the circuit operation, the transistor 11 is arranged as an emitter follower and the transistor 12 is arranged as a grounded base amplifier. Approximately, the output impedance is zero and the input impedance is infinite for the emitter follower, and the input impedance is zero and the output impedance is infinite for the grounded base arrangement. Then, it leads to that when a voltage E is applied to the input terminal 10, that is, to the base of the transistor 11, the voltage E is applied to the capacitor 13 to flow a current I equal to $j\omega CeE$, if the base-emitter voltages of the transistors 11 and 12 are neglected (the voltage is represented with respect to alternating current by a emitter resistance and an analysis considering the emitter resistance is to be conducted later). The current I is passed through the emitter and the collector of the transistor 12 and fed back to the input terminal 10. The impedance in the circuit of the transistors 11 and 12 is therefore negative viewing from the side of the terminal 10 and, since $I = -j\omega CeE$, the impedance $Ze_3$ is represented as:

$$Ze_3 = \frac{E}{I} = -\frac{1}{j\omega Ce} \tag{7}$$

Figure 7:
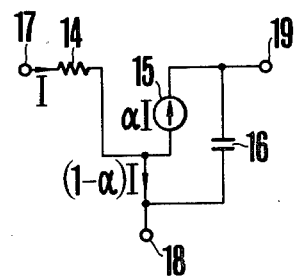
FIG. 7 is an equivalent circuit diagram for a transistor.

The negative capacitance of a capacitance value $-Ce$ can thus be attained. A more accurate analysis is to be made for the circuit shown in FIG. 5. Since the equivalent circuit for a transistor can be represented as shown in FIG. 7, the circuit of FIG. 6 using such transistor can be represented as FIG. 8, which includes emitter resistances 14, 21, and 22 having resistance values re, re1 and re2 respectively, a current source 15, collector capacitances 16, 23 and 24 having capacitances Cc, Cc1 and Cc2 respectively, grounded base current amplification factor $\alpha$ and terminals 17, 18 and 19 for emitter, base and collector respectively. For the voltage E applied to the input terminal, current I that flows out, current i that flows into the capacitor 13 and the amplification factors $\alpha 1$ and $\alpha 2$ of the transistors 11 and 12 in this circuit, the following equations (8) and (9) are established:

$$E = i \{ re1 + re2 + \frac{1}{j\omega Ce} \} \tag{8}$$

$$I = j\omega Cc1 E + j\omega Cc2 E - i\alpha 2 + (1 - \alpha 1)i \tag{9}$$

Combining (8) and (9) to eliminate i forms:

$$I = E \{ j\omega Cc1 + j\omega Cc2 + (1 - \alpha 1 - \alpha 2) \frac{J\omega Ce}{1 + J\omega Ce(re1 + re2)} \tag{10}$$

Figure 8:
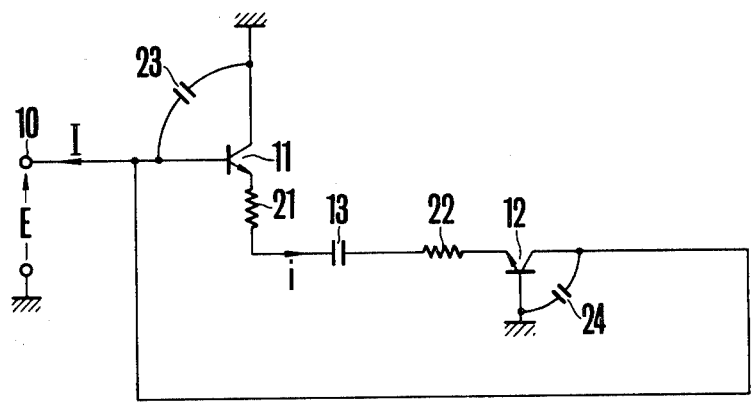
FIG. 8 is a similar but more detailed circuit diagram of FIG. 6.
Figure 9:
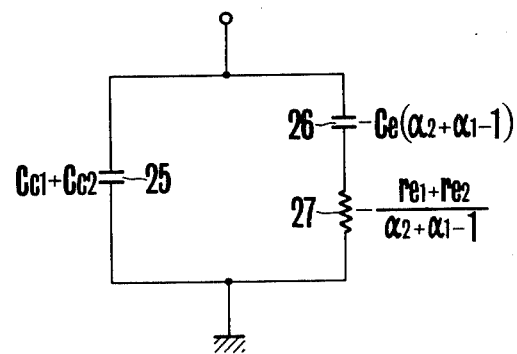
FIG. 9 is an equivalent circuit diagram in FIG. 8.

Accordingly the input admittance Ye can be represented as:

$$Ye = \frac{I}{E} = j\omega(Cc1 + Cc2) + \frac{j\omega Ce(1 - \alpha 1 - \alpha 2)}{1 + j\omega Ce(re1 + re2)} \tag{11}$$

and then the circuit in FIG. 8 can be represented by the equivalent circuit in FIG. 9, in which are shown a capacitance 25 of a capacitance value Cc1+Cc2, a negative capacitance 26 of a capacitance value $-Cc(\alpha 1 + \alpha 2 - 1)$ and a negative resistance of a resistance value $$-\frac{re1 + re2}{\alpha 2 + \alpha 1 - 1}$$

If the following equation:

$$\frac{1}{j\omega Ce} >> re1 + re2 \tag{12}$$

is satisfied, the second term on the right side of the equation (11) approximately equals to $J\omega Ce(1-\alpha 1-\alpha 2)$. Then, the negative capacitance C represented by the following equation (13) can be obtained by the circuit shown in FIG. 6:

$$C = -Ce(\alpha 2 + \alpha 1 - 1) + Cc1 + Cc2 \tag{13}$$

The characteristics of the immitance conversion circuit (such as a NIC, gyrator, rotator and the like in which the above circuit is included) are generally degraded chiefly due to the collector capacitance, but the collector capacitance Cc1+Cc2 in this circuit shown in FIG. 6 is connected in parallel with the input terminals as shown in the equivalent circuit of FIG. 9 and can be cancelled out with the negative capacitance $-Cc(\alpha 2 +\alpha 1-1)$. Then, the negative capacitance of good characteristics can be expected.

Figure 10:
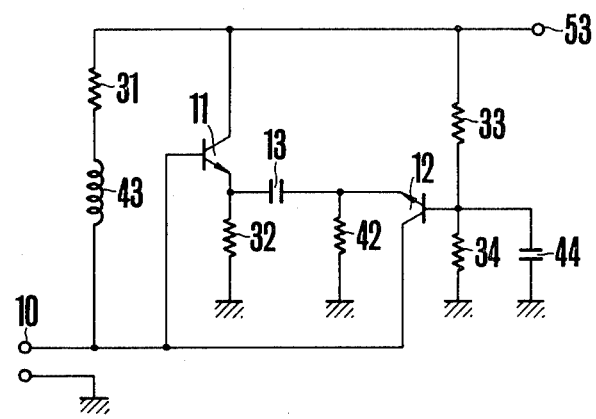
FIG. 10, FIG. 11 and FIG. 12 are circuit diagrams showing specific embodiments of the negative capacitance circuit shown in FIG. 6 incorporated with dc bias circuits respectively.
Figure 11:
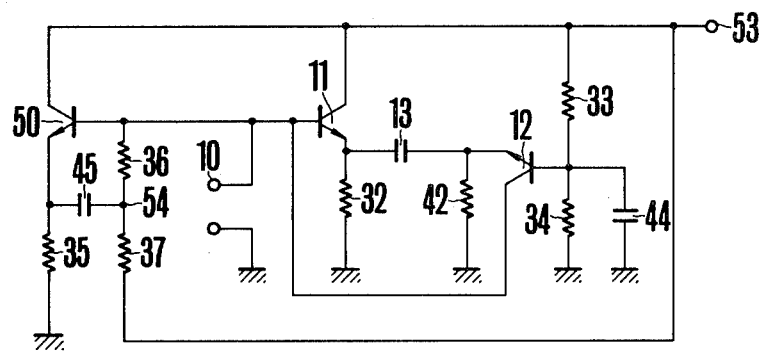
Figure 12:
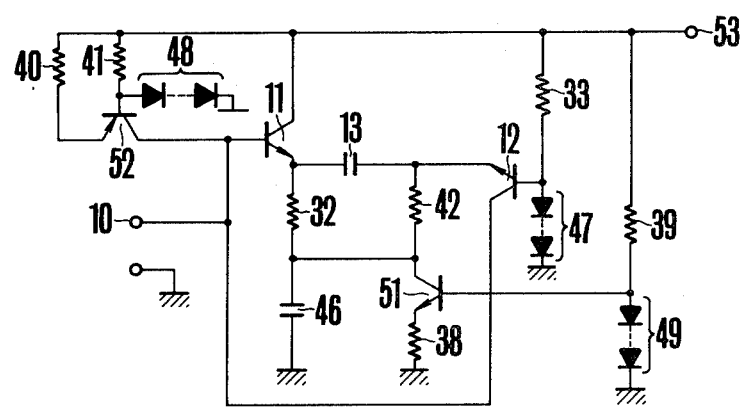

While FIG. 6 shows exclusively those circuit portions concerning alternating current, dc bias circuits added thereto are shown in FIG. 10 through FIG. 12. In these figures, are shown resistors 31-42, an inductance 43, by-pass capacitors 44-46, diode arrays 47-49, and transistors 50-52. Throughout these and other figures, same portions and parts always carry the same references. A bias circuit is required at the input terminal 10 in order to apply a bias voltage to the base of the transistor 11 and to cause the bias current to flow to the transistor 12, and ac impedance of the circuit has to be high enough to form a good circuit characteristic since the bias circuit is connected in parallel with the input terminal 10. In view of the above, the following measures are taken. In FIG. 10, an inductance 43 is inserted in series to a resistor 31 between a power source 53 and the input terminal 10 to sufficiently increase the ac resistance. For the circuit between the input terminal and the ground, there are no problems since the transistor 11 is arranged as an emitter follower with its input impedance being infinite and the transistor 12 is arranged as a grounded base arrangement grounded through a capacitor 44 with its output impedance being infinite. In FIG. 11, a transistor 50 is used for the bias circuit and the bias is applied to transistors 11 and 12 through a series circuit of resistors 36 and 37 connected to the power source 53. The transistor 50 is arranged as an emitter follower and its emitter resistor 35 is connected by way of a capacitor 45 to the junction point 54 between the above resistors 36 and 37 to reduce ac current flowing through the resistor 36, that is, increase the ac resistance of the resistor 36. In the circuit shown in FIG. 12, a constant current circuit comprising a transistor 52, resistors 40 and 41 and a diode array 48 consisting of a plurality of series-connected diodes is used as the bias circuit to increase the impedance. While on the other hand, a constant current circuit comprising a transistor 51, resistors 38, 39 and a diode array 49 is used to determine the current of the transistor 11 and the base voltage of the transistor 11. The above circuit can be arranged as an IC circuit by providing capacitors 13 and 46 externally.

Figure 13:
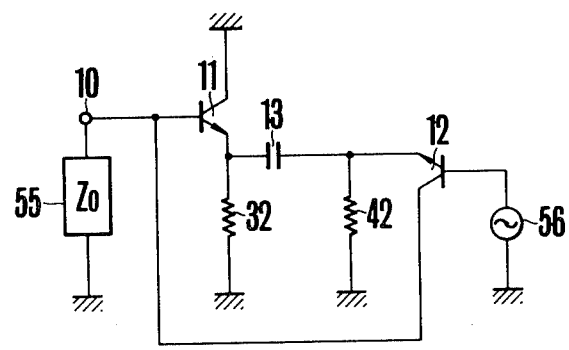
FIG. 13 is a circuit diagram for the illustration of calculation for thermal noises in the circuit shown in FIG. 6.

Since the above negative capacitance circuits generate noises due to various causes, consideration is to be made for the noises generated in the base of the transistor 11, for example, thermal noises due to the base resistance referring to FIG. 10. In FIG. 13, noise voltage Vn produced in the vicinity of the base of transistor 12 is represented as 56 and an impedance Zo of bias circuit elements attaching to or added to the input terminal 10 are shown as 55. When the noise voltage Vn is generated, it appears on the input terminal 10 as the voltage Vn represented as:

$$Vn = \frac{VnZo}{j\omega CeZo - 1} (J\omega Ce + \frac{1}{RE}) \quad (14),$$

where Re represent the resistance value for the resistor 42.

Figure 14:
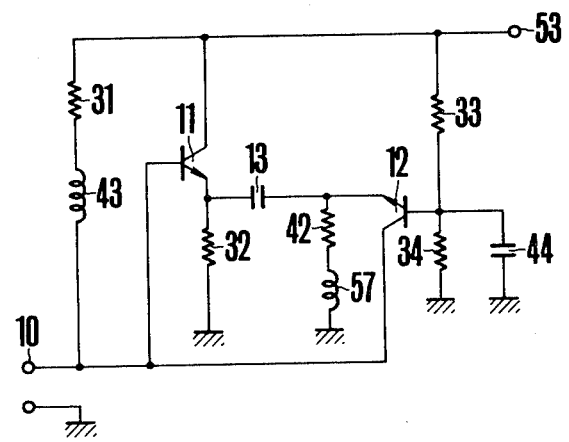
FIG. 14 is a circuit diagram in FIG. 10 to which countermeasure is applied for thermal noises.

As apparent from the equation (14), the noise input voltage Vn can be reduced to improve the S/N ratio as the resistance 42 for the dc bias to the transistor 12 becomes greater with regard to ac resistance. Then, the S/N improvement can be attained by the serial connection of an inductance 57 to the resistor 42 as shown in FIG. 14. In the circuits shown in FIG. 11 and FIG. 12, the S/N ratio can also be increased by the serial connection of an inductance to the resistor 42.

Figure 15:
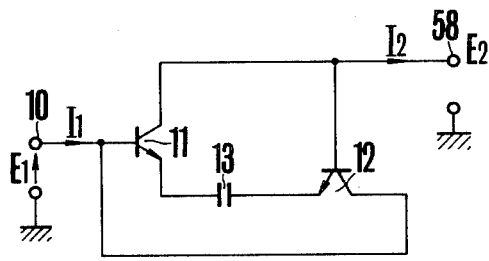
FIG. 15 is a circuit diagram showing a modification of the circuit in FIG. 6.
Figure 16:
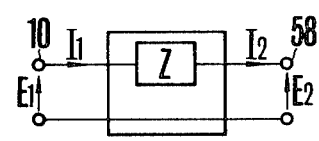
FIG. 16 is an equivalent circuit diagram for the circuit in FIG. 15.

A modification of the embodiment shown in FIG. 6 is now referred to. While the collector of the transistor 11 and the base of the transistor 12 are grounded in FIG. 6, they may be insulated from the ground as in another embodiment shown in FIG. 15. The circuit can be considered as a four terminal network shown in FIG. 16 as:

$$\begin{vmatrix} E1 \\ I1 \end{vmatrix} = \begin{vmatrix} 1 & Z \\ 0 & 1 \end{vmatrix} \begin{vmatrix} E2 \\ I2 \end{vmatrix} \quad (15),$$

where E1 is a voltage on the input terminals, I1 is current, E2 is a voltage on terminal 58 and I2 is current. Assuming that the transistors 11 and 12 behave quite theoretically, the equation:

$$I1 = (E2-E1)j\omega Ce = I2 \quad (16),$$

is obtained and, accordingly, the equation:

$$E1 = E2 - \frac{I2}{j\omega Ce}, I1 = I2 \quad (17)$$

is obtained. Then, from the equations (15) and (17), the equation:

$$Z = -\frac{1}{j\omega Ce} \quad (18)$$

is obtained, which shows that the circuit shown in FIG. 15 is also a negative capacitance circuit.

Figure 17:
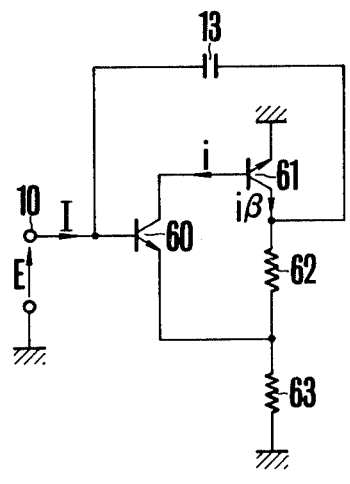
FIG. 17 is a circuit diagram showing second embodiment of the negative capacitance circuit.

While the foregoing circuit is of a current feed back type, the circuit shown in FIG. 17 is a voltage feed back type circuit, in which are shown transistors 60 and 61 and resistors 62 and 63. In the above circuit, the following equations are satisfied:

$$E = \frac{1}{j\omega Ce} (\frac{E}{R14} - i - i\beta) + \frac{R13}{R14} E - iR13 + E \quad (19)$$

$$I = \frac{E}{R14} - i - i\beta \quad (20)$$

Figure 18:
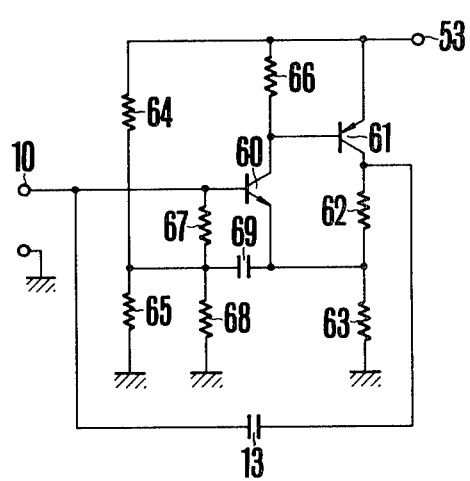
FIG. 18 is a circuit diagram showing the circuit shown in FIG. 17 incorporated with a dc bias circuit.

Since $\beta \gg 1$, $$Z = \frac{E}{I} \approx -\frac{R14}{j\omega CeR13} \quad (21)$$

and a negative capacitance -R13Ce/R14 is resulted, in which R13 and R14 represent the resistance values of the resistors 62 and 63 respectively and $\beta$ denotes a current amplification factor. FIG. 18 shows a circuit in which a dc bias circuit is added to the ac circuit shown in FIG. 17. In this circuit are shown resistors 62-68 and a capacitor 69. In this circuit the resistance value of the resistor 63 in the circuit shown in FIG. 17 is equal to that of the parallel resistors 63, 64, 65 and 68 connected in parallel to each other. As can be seen from FIG. 18, constitution of a dc bias circuit is much easier for the circuit shown in 6 than that in FIG. 6.

Figure 19:
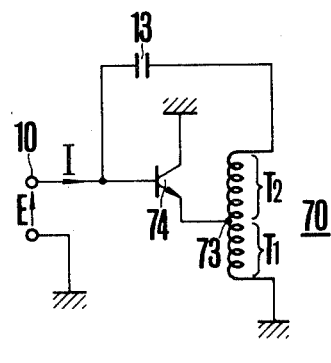
FIG. 19, FIG. 20 and FIG. 21 are circuit diagrams for showing third, fourth and fifth embodiments of the negative capacitance circuit using a transformer.
Figure 20:
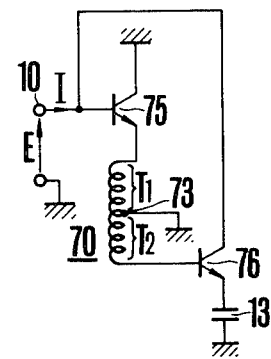

While two transistors are used in each of the circuit shown in FIG. 6, FIG. 15 and FIG. 17 for obtaining the negative capacitance, the number of the transistors can be diminished to one by the use of a transformer, one example of which is shown in FIG. 19. In this embodiment, a tapped coil grounded at one end is used in which a coil 70 has a tap 73. One transistor 74 is used with the collector being grounded, the emitter being connected to the tap 73 and the base being connected to the input terminal 10 and by way of a capacitor 13 to the other end of the transformer 70. In this circuit, the following equations are approximately established:

$$I \approx (E - \frac{T1 + T2}{T1} E) j\omega Ce = -\frac{T2}{T1} J\omega CeE \quad (22)$$

$$Ze = \frac{E}{I} = -\frac{T1}{T2 j\omega Ce} \quad (23),$$

where T1 represents number of turns between the one end of the transformer 70 and the tap 73 and T2 represents number of turns between the tap 73 and the other end of the transformer 70. As apparent from the equation (23), this circuit exhibits a negative capacitance of a capacitance value (T2/T1)Ce. The tap of the coil may be grounded and its example is shown in FIG. 20.

In the embodiment shown above, the following equations are established:

$$I \approx -E \frac{T2}{T1} j\omega Ce \quad (24)$$

$$Ze = \frac{E}{I} = -\frac{T1}{j\omega CeT2} \quad (25)$$

Figure 21:
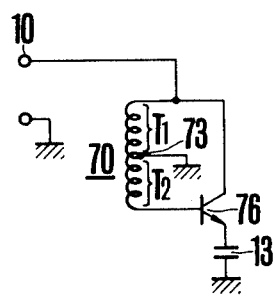

As apparent from the equation (25), the negative capacitance of the capacitance value (T2Ce/T1) can also be obtained. In this circuit, a transistor 75 connected as an emitter follower is employed so as to prevent the impedance in the windings T1 of the transformer 70 from adding in parallel with the input terminal 10 and the transistor 75 can be omitted as shown in FIG. 21 if such prevention is unnecessary.

Figure 22:
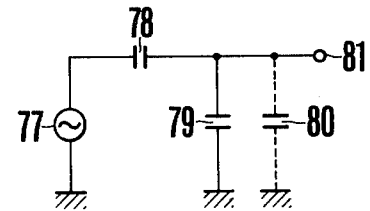
FIG. 22 is a circuit diagram showing an example of application of the negative capacitance circuit.

The above negative capacitance circuit can be used not only for cancelling the stray capacity but also utilized as an amplification use. For example, voltage E2 at a point 8 in the circuit shown in FIG. 22 comprising a power source of a voltage E1, a series capacitor 78 of a capacitance value CA and a stray capacity 79 of a capacitance value Cs is represented as:

$$E2 = E1 \frac{CA}{CA + Cs} \quad (26)$$

If a negative capacitance circuit 80 having a capacitance value −C is connected in parallel with the stray capacity 79, the voltage E at the point 8 is represented as:

$$E2 = E1 \frac{CA}{CA + Cs - C} \quad (27)$$

Then, putting the capacitance value C closer to CA+CB, E2 can be made greater than E1 to result in a gain in this circuit.

Figure 23:
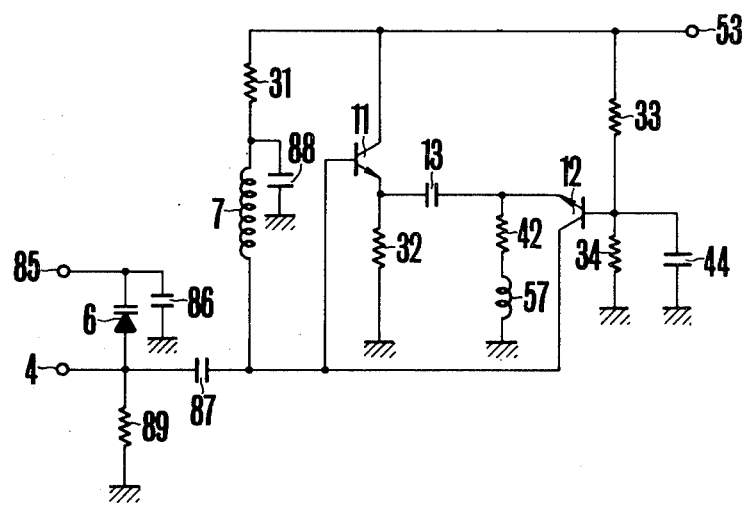
FIG. 23, FIG. 24 and FIG. 25 are circuit diagrams showing embodiments of this invention including dc bias circuits respectively.
Figure 24:
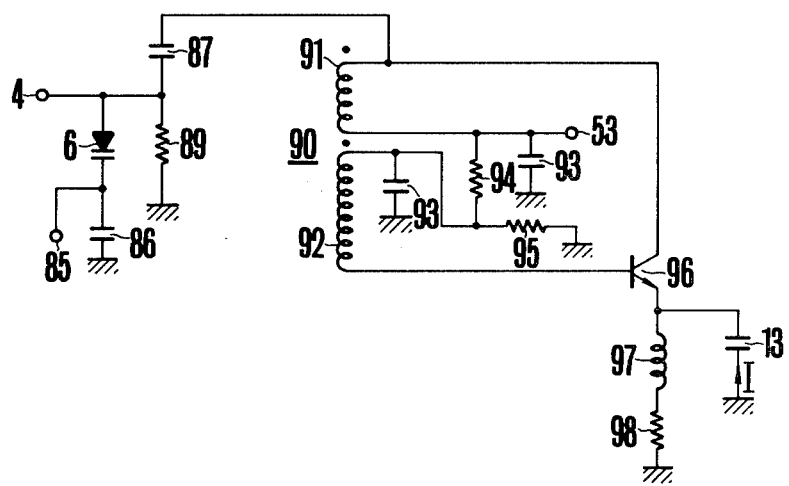
Figure 25:
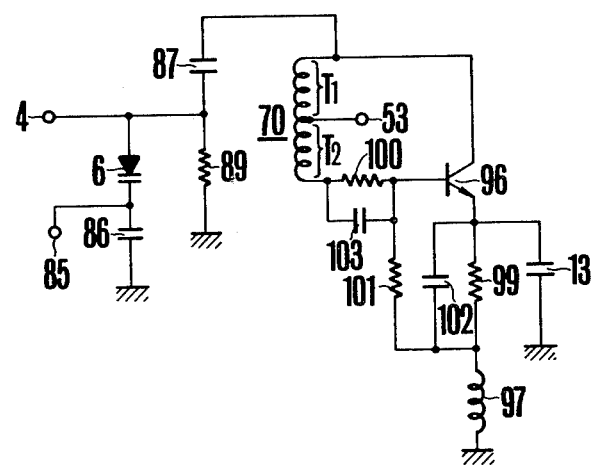

Embodiments of the variable capacitance type tuning circuit using such a negative capacitance circuit are shown in FIG. 23 through FIG. 25.

In FIG. 23, the antenna circuit shown in FIG. 1 is connected to a terminal 4, a circuit including transistors 11 and 12 constitutes a negative capacitance circuit and a variable capacitance 6 such as a varicap diode is used. A dc control voltage is applied to a terminal 85 so as to change the capacitance value of the variable capacitance 6 by means of a resistor 89 having a high resistance. To the other end of the variable capacitance 6 is connected a by-pass capacitor 86, through which it is grounded to the earth with respect to ac current. Reference numeral 87 represents a coupling capacitor. The negative capacitance circuit comprises transistors 11 and 12, resistors 31–34 and 42 a capacitor 13 for attaining a negative capacitance, by-pass capacitors 44 and 88 and an inductor 57.

The resistors 33, 34 and 42 and the inductor 57 form a circuit for supplying a bias current to the transistor 12, and the capacitor 44 is used for grounding the transistor 12 to the earth with respect to ac current. The inductor 7 is used for increasing the ac impedance of the resistor 31 connected in parallel with the negative capacitance as foregoings and also serves as the inductor in the antenna tuning circuit. Since it is desired for the inductor in the antenna tuning circuit to be grounded at its one end so as to be connected in parallel with the variable capacitance 6, the inductor 7 is grounded at one end through the capacitor 88 with respect to ac current. The output of this circuit may be taken out through secondary windings provided to the inductor 7 but it is more convenient to take out the output from the emitter of the transistor 11.

In the embodiment shown in FIG. 24, one transistor 96 and a transformer 90 are employed for attaining the negative capacitance. Primary windings 91 of the transformer 90 are connected between a power source 53 and an input terminal 4 through a coupling capacitor 87 and secondary windings 92 are connected at one end through a resistor 94 to the power source 53 and grounded through a resistor 95 to the earth. Polarity of the windings 91 and 92 are represented by references ".", and reference numerals 86, 93 represent by-pass capacitors. When a voltage E is applied from the antenna circuit to the terminal 4 in this circuit, the voltage is applied to the windings 91 to induce a voltage T2/T1 E in the windings 92, where T1 and T2 represent number of turns of the windings 91 and 92 respectively. The voltage T2/T1 E is applied through the base-emitter of the transistor 96 to the capacitor 13 causing current I at the value of jωCeT2/T1 E to flow therethrough. Since the windings 91 and 92 have the polarity as shown in the figure, the current I flows in the direction passing through the transistor 96 back to the input terminal 4. Accordingly, the input admittance Ze is represented as:

$$Ze = \frac{I}{E} = -\frac{T}{T2 \cdot j\omega Ce} \quad (28)$$

and this circuit exhibits a negative capacitance of −(T2/T1)Ce. In this circuit the primary windings 91 of the transformer 90 also acts as the inductor 7 for resonance. The output can be taken out by the provision of additional secondary windings. The transformer 90 can be substituted with a tapped coil as shown in FIG. 25, in which are shown resistors 100 and 101, by-pass capacitors 102 and 103 and a coil 70 with a tap. The circuit operation and the value of the negative capacitance attained are the same as foregoings.

Figure 26:
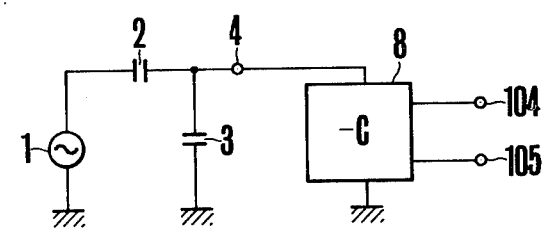
FIG. 26 is an outlined circuit diagram showing another embodiment in which the performance of the antenna circuit is improved.

In addition to the offset of the antenna capacitance and the like, increase in the gain of the antenna circuit as shown in FIG. 26 is also effective for improving the performance of the antenna circuit by the use of the negative capacitance. The voltage E at a point 4 in this circuit is represented as;

$$E2 = E1 \frac{CA}{CA + CB - C} \qquad (29)$$

By putting the capacitance value C closer to CA+CB, E2 can be made greater than E1 to thereby improve the S/N ratio. The output can be taken out through a buffer amplifier provided in a negative capacitance circuit 8.

As apparent from the equation (29), since the output voltage E2 is changed by the variation of the negative capacitance value, a sort of AGC action can be performed for a high input by varying the negative capacitance value by the control voltage applied to a terminal 105 to thereby change the output voltage issued from a terminal 104.

According to this invention, as specifically described above, various advantages can be obtained such as the improvement in the S/N ratio by the offset of the stray capacity in the antenna circuit and easier electronic tuning.

What is claimed is:

1. In a radio receiver having an antenna circuit represented by an equivalent circuit consisting of an antenna electromotive force, an antenna capacitance in series with said electromotive force and a cable capacitance in parallel therewith and a tuning circuit for the selection of stations upon receiving the output of said antenna circuit, the improvement comprising:
   a negative capacitance circuit comprising a capacitor and a control circuit including one or two transistors said negative capacitance circuit, upon receiving an input voltage corresponding to the antenna electromotive force on an input terminal thereof, applies said input voltage or a voltage in proportion thereto to said capacitor thereby providing a current determined by the reactance of said capacitor to said input terminal, said negative capacitance at least partially cancelling the cable capacitance and the antenna capacitance.

2. In a radio receiver having an antenna circuit represented by an equivalent circuit consisting of an antenna electromotive force, an antenna capacitance in series with said electromotive force and a cable capacitance in parallel therewith, and a tuning circuit for the selection of stations upon receiving the output of said antenna circuit, the improvement comprising:
   a negative capacitance circuit, at least partially cancelling the cable capacitance and the antenna capacitance and including:
   a capacitor, and
   a control circuit including a first and a second transistor,
   wherein the first transistor is connected as an emitter follower and receives an input voltage corresponding to the antenna electromotive force at its base and is connected at its emitter with one end of said capacitor, and the second transistor, connected as a grounded base arrangement, has its emitter connected with the other end of said capacitor and its collector connected with the base of said first transistor.

3. In a radio receiver having an antenna circuit represented by an equivalent circuit consisting of an antenna electromotive force, an antenna capacitance in series with said electromotive force and a cable capacitance in parallel therewith, and a tuning circuit for the selection of stations upon receiving the output of said antenna circuit, the improvement comprising:
   a negative capacitance circuit, at least partially cancelling said cable capacitance and the antenna capacitance, and including:
   a capacitor, and
   a control circuit including a first and a second transistor,
   wherein the first transistor receives an input voltage corresponding to the antenna electromotive force at its base and is connected at its collector to the base of the second transistor and at its emitter to the junction point between serially connected first and second resistors, and the second transistor is grounded at its emitter to the earth and connected at its collector to one end of said capacitor and the other end of said first resistor, the other end of said capacitor is connected to the base of said first transistor and the other end of said second resistor is grounded to the earth.

4. In a radio receiver having an antenna circuit represented by an equivalent circuit consisting of an antenna electromotive force, an antenna capacitance in series with said electromotive force and a cable capacitance in parallel therewith, and a tuning circuit for the selection of stations upon receiving the output of said antenna circuit, the improvement comprising:
   a negative capacitance circuit at least partially cancelling said cable capacitance and the antenna capacitance, comprising:
   a capacitor, and
   a control circuit including a transistor and a coil with a tap,
   wherein said transistor receives an input voltage corresponding to the antenna electromotive force at its base, is grounded at its collector to the earth and connected at its emitter with the tap of said coil and said coil is grounded at its one end to the earth and connected at the other end to one end of the capacitor, the other end of which is connected to the base of said transistor.

5. In a radio receiver having an antenna circuit represented by an equivalent circuit consisting of an antenna electromotive force, an antenna capacitance in series with said electromotive force and a cable capacitance in parallel therewith, and a tuning circuit for the selection of stations upon receiving the output of said antenna circuit, the improvement comprising:
   a negative capacitance circuit, at least partially cancelling said cable capacitance and the antenna capacitance, including:
   a capacitor, and
   a control circuit including a first and second transistor and a coil with a tap,
   wherein the first transistor receives an input voltage corresponding to the antenna electromotive force at its base, is grounded at its collector to the earth and connected at its emitter to one end of the coil whose tap is grounded to the earth and the other end is connected to the base of the second transistor, and the second transistor is connected at its emitter to one end of the capacitor and at its collector to the base of said first transistor and the other end of said capacitor is ground to the earth.

6. In a radio receiver having an antenna circuit represented by an equivalent circuit consisting of an antenna electromotive force, an antenna capacitance in series with said electromotive force and a cable capacitance in parallel therewith, and a tuning circuit for the selection of stations upon receiving the output of said antenna circuit, the improvement comprising:
- a negative capacitance circuit, at least partially cancelling said cable capacitance and the antenna capacitance, including:
  - a capacitor, and
  - a control circuit including a transistor and a coil with a tap, wherein an input voltage is applied to one end of said coil and to the collector of said transistor, said coil is grounded through its tap to the earth and connected at the other end to the base of said transistor, and said transistor is connected at its emitter to one end of a capacitor, whose other end is grounded to the earth.

* * * * *

UNITED STATES PATENT AND TRADEMARK OFFICE
CERTIFICATE OF CORRECTION

PATENT NO. : 4,215,312                    Page 1 of 2
DATED      : July 29, 1980
INVENTOR(S): Kazuo Takayama It is certified that error appears in the above—identified patent and that said Letters Patent is hereby corrected as shown below:

Front page title should read:--Radio Receiver Having Antenna Coupled Negative Capacitance Circuit To Reduce Antenna and Cable Capacitance Column 1 title should read:--Radio Receiver Having Antenna Coupled Negative Capacitance Circuit to Reduce Antenna and Cable Capacitance --.

Column 5, line 64 please delete "Re" and insert --RE--

Column 7, lines 44, 45 and 53 "Cs" should be --CS--

Column 8, line 50 the equation should read as follows:

$$Ze = \frac{I}{E} = - \frac{T1}{T2 \cdot j\omega Ce} \quad \dots\dots\dots\dots\dots\dots\dots\dots (28)$$

Column 9, line 39 after "capacitance" add --circuit--

UNITED STATES PATENT AND TRADEMARK OFFICE
CERTIFICATE OF CORRECTION

PATENT NO. : 4,215,312
DATED : July 29, 1980
INVENTOR(S) : Kazuo Takayama

It is certified that error appears in the above—identified patent and that said Letters Patent is hereby corrected as shown below:

Column 2, line 7 please delete "capacitances" and insert --capacitance--

Column 3, line 19 please delete "capacitor" and insert --capacitance--

Signed and Sealed this

Twenty-first Day of April 1981

[SEAL]

Attest:

RENE D. TEGTMEYER

Attesting Officer

Acting Commissioner of Patents and Trademarks